United States Patent
Schaefer et al.

(10) Patent No.: US 8,074,905 B2
(45) Date of Patent: Dec. 13, 2011

(54) METHOD AND DEVICE FOR COMMINUTING AND SORTING POLYSILICON

(75) Inventors: Marcus Schaefer, Traunstein (DE); Reiner Pech, Neuoetting (DE); Matthaeus Schantz, Reut (DE)

(73) Assignee: Wacker Chemie AG, Munich (DE)

( * ) Notice: Subject to any disclaimer, the term of this patent is extended or adjusted under 35 U.S.C. 154(b) by 1082 days.

(21) Appl. No.: 11/692,969

(22) Filed: Mar. 29, 2007

(65) Prior Publication Data
US 2007/0235574 A1    Oct. 11, 2007

(30) Foreign Application Priority Data
Apr. 6, 2006 (DE) .......................... 10 2006 016 323

(51) Int. Cl.
*B02C 19/00* (2006.01)
(52) U.S. Cl. .............................. 241/1; 241/24.1; 241/27
(58) Field of Classification Search ................ 241/1, 22, 241/24.1, 27
See application file for complete search history.

(56) References Cited

U.S. PATENT DOCUMENTS

| | | | |
|---|---|---|---|
| 4,871,117 A | 10/1989 | Baueregger et al. | |
| 4,881,689 A | 11/1989 | Lippuner et al. | |
| 5,346,141 A * | 9/1994 | Kim et al. .......................... | 241/5 |
| 6,040,544 A * | 3/2000 | Schantz et al. ................. | 209/577 |
| 6,265,683 B1 | 7/2001 | Flottmann et al. | |
| 6,309,467 B1 | 10/2001 | Wochner et al. | |
| 6,375,011 B1 | 4/2002 | Flottmann et al. | |
| 7,013,620 B2 | 3/2006 | Holziwimer et al. | |
| 7,549,600 B2 * | 6/2009 | Hesse et al. ................... | 241/24.1 |
| 2006/0088970 A1 * | 4/2006 | Hesse et al. ................... | 438/309 |
| 2006/0243834 A1 | 11/2006 | Schantz et al. | |

FOREIGN PATENT DOCUMENTS

| | | |
|---|---|---|
| DE | 241557 A1 | 12/1986 |
| DE | 3811091 A1 | 10/1989 |
| DE | 10 2005 019 873 A | 11/2006 |
| EP | 0 876 851 B1 | 11/1998 |
| EP | 1 043 249 B1 | 11/2001 |
| EP | 1 338 682 A2 | 8/2003 |
| EP | 1334907 A1 | 8/2003 |
| EP | 1 334 907 B1 | 4/2004 |
| JP | 5589002 A | 7/1980 |
| JP | 5767019 | 4/1982 |
| JP | 58145611 A | 8/1983 |
| JP | 638044 B2 | 2/1988 |
| JP | 2000296345 A | 10/2000 |
| JP | 2001262581 A | 9/2001 |
| JP | 2004016983 A | 1/2004 |

OTHER PUBLICATIONS

US 7,013,620 B2 is corresponding to EP 1 334 907 B1.
US 2006/0243834 A1 is corresponding to DE 10 2005 019 873 A1.
US 6,040,544 is corresponding to EP 0 876 851 B1.
US 6,375,011 B1 is corresponding to EP 1 043 249 B1.
Derwent Abstract corresponds to DD241557A1.
US487117 corresponds to DE3811091A1.
US7013620B2 corresponds to EP1334907A1.
Patent abstract corresponding to JP57-67019.

* cited by examiner

*Primary Examiner* — Bena Miller
(74) *Attorney, Agent, or Firm* — Brooks Kushman P.C.

(57) ABSTRACT

The invention relates to a device for comminuting and sorting polycrystalline silicon, comprising an instrument for feeding a coarse polysilicon fraction into a crushing system, the crushing system associated with a sorting system for classifying the polysilicon fraction, wherein the device is provided with a controller which allows variable adjustment of at least one crushing parameter in the crushing system and/or at least one sorting parameter in the sorting system.

13 Claims, 3 Drawing Sheets

| | 90 mm Gap width | 30 mm Gap width | 18 mm Gap width | 8 mm Gap width |
|---|---|---|---|---|
| Size 5 | 55 | 0 | 0 | 0 |
| Size 4 | 36 | 78 | 3 | 0 |
| Size 3 | 5 | 9 | 52 | 20 |
| Size 2 | 2.5 | 5 | 26 | 35 |
| Size 1 | 1 | 5 | 12 | 31 |
| Size 0 | 0.5 | 3 | 7 | 14 |

METHOD AND DEVICE FOR COMMINUTING AND SORTING POLYSILICON

BACKGROUND OF THE INVENTION

1. Field of the Invention

The invention relates to a method and a device for comminuting and sorting highly pure polycrystalline silicon.

2. Background Art

Highly pure polycrystalline silicon, referred to below as polysilicon, is used, inter alia, as a starting material for the production of electronic components and solar cells. It is obtained by thermal decomposition of a gas containing silicon or a gas mixture containing silicon. This process is referred to as chemical vapor deposition (CVD). On a large scale, this process is carried out in so-called Siemens reactors. The polysilicon is thereby created in the form of rods, which are then generally comminuted by means of manual methods. The coarse polysilicon fraction thus obtained has an irreproducible size distribution, with hardly any smaller fraction sizes being created in large quantities. A range of machine-based methods are known, in which a manually pre-comminuted coarse polysilicon fraction is further comminuted by using conventional crushers. Mechanical crushing methods are described, for example, in EP 1 338 682 A2. Mechanical crushing methods in combination with an elaborate thermal pre-treatment of the polysilicon rods are also known, which are intended to allow simpler crushing of the polysilicon (for example EP 1 338 682 A2). The polysilicon fraction is subsequently classified by a screening method, for example a mechanical screening method as known from EP 1043249 B1, or optical sorting as is known for example from U.S. Pat. No. 6,265,683 B1.

In the past, sorting or "classifying" polysilicon fractions has always been decoupled from comminution. Thus, isolation of fractions with targeted particle size distributions may entail considerable waste, and adjustment of the crushing to minimize this waste is largely a trial and error process.

SUMMARY OF THE INVENTION

It is an object of the present invention to provide a device for comminuting and sorting polysilicon, which makes it possible to produce reproducible polysilicon fractions having defined properties with an increased yield, in a single continuous system. These and other objects are achieved by a device comprising a means for feeding a coarse polysilicon fraction into a crushing system, the crushing system associated with a sorting system for classifying a crushed polysilicon fraction, wherein the device is provided with a controller which allows variable adjustment of at least one crushing parameter in the crushing system and/or at least one sorting parameter in the sorting system in response to deviations from a targeted parameter or plurality of parameters. Preferably, the device furthermore comprises a conveyor device from the crushing system to the sorting system.

DETAILED DESCRIPTION OF THE PREFERRED EMBODIMENT(S)

Figure 1:
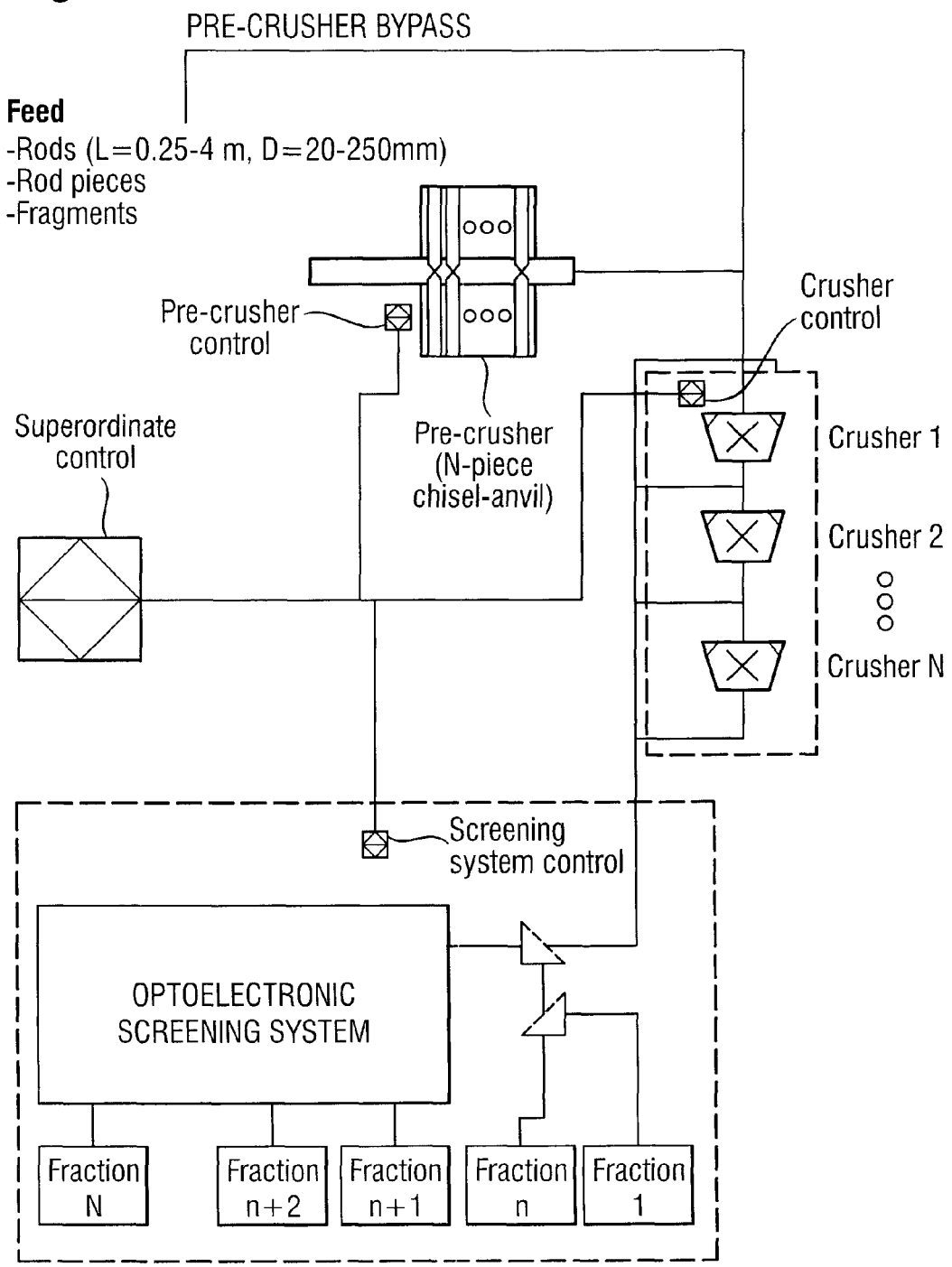
FIG. 1 shows one embodiment of a device according to the invention with a pre-crusher.

A preferred embodiment of the device is one wherein the sorting system is provided with a measuring instrument(s) for defined parameters of the classified polysilicon fraction, and the measuring instrument is connected to a superordinate control and regulating means which statistically evaluates the measured parameters and compares them with a predetermined parameter and, if there is a deviation between the measured parameter and the predetermined parameter, modifies the setting of the crushing parameters of the crushing system so that the parameter then measured approximates the predetermined parameter.

A parameter from the group of length, surface, shape, morphology, color and weight of the polysilicon fragments is preferably measured. The length of a fragment is preferably defined as the longest linear distance between two points on the surface of the fragment. The surface of a fragment is preferably defined as the largest shadow surface of the fragment as projected into a plane.

Most preferably, the length or the surface of the polysilicon fragments is measured and evaluated in the form of length or surface distributions (for example 5%, 50% or 95% quartile). As an alternative, the weight yields of the individual screen fractions are determined by the balances at the screen outputs. Either the individual fractions' weights recorded by a weighing device or the individual fractions' length distributions measured in the optoelectronic separating system may be used in order to stabilize the desired yields. For example, if the quantitative yield of large fragments is too great or the fraction distribution's average length value (actual value) determined in the first optical separating stage is greater than the setpoint value, then the gap distance is reduced according to logic established in the formula, so that the fraction distribution is thereby shifted toward smaller sizes.

As indicated previously, in the prior art, the sorting of polysilicon fractions has always been decoupled from the comminution. To date, therefore, it has not been possible to regulate the comminution of the polysilicon as a function of the crushing result. The inventive combination and preferable feedback of the measurement values from optoelectronic sorting and/or the balances at the sorting outputs with data acquisition and data evaluation as well as the integration of all system components, including the crushers, in a superordinate controller, for the first time allows expedient real-time regulation of the comminution in order to achieve a reproducibly defined polysilicon fraction with good yields.

The crushing system is preferably a multistage crushing system consisting of from 1 to 10 crushers (corresponding to 1 to 10 crushing stages), preferably 1 to 3 crushers. All known crushers may be used. Roll crushers or jaw crushers are preferably used. Roll crushers with synchronously running rolls are preferably used. Spiked roll crushers are most preferably used as roll crushers.

Variably adjustable crushing parameters of the crushers are preferably the gap distance (tooth tip to opposite roll bottom) or the rotational speeds of the rolls. These parameters may be varied in the superordinate control and regulating device.

For the individual crushing stages, surprisingly, fixed parameters (for example diameter of the rolls, tooth spacing, tooth height) can be adjusted so that it is possible to produce a multiplicity of target polysilicon fractions with different particle size ranges by means of a one- or multistage crushing system, merely by varying the gap spacing and the rotational speed of the rolls. In this case, a target fraction is intended to mean the size fraction which has the highest yield out of the entire fraction size spectrum after the comminution and classification.

The diameter, tooth spacing and tooth height of a roll crusher are preferably selected as follows:

The tooth spacing on a roll is defined by the diagonal between the midpoints of two adjacent teeth. The tooth spacing is conventionally selected in a range of 5-200 mm: in a two-stage crushing system, preferably 100-200 mm in the first crushing stage and 5-100 mm in the second crushing stage: in a three-stage crushing system, preferably 100-200 mm in the first crushing stage, 50-100 mm in the second crushing stage, and 5-50 mm in a third crushing stage. The tooth height is conventionally selected to be 5-100 mm. The tooth shape may be cylindrical, conical, pyramidal or a combination of these shapes. The roll diameter conventionally lies in the range of 200-2000 mm: in a two-stage crushing system preferably 800-2000 mm in the first stage and 200-800 mm in the second crushing stage: in a three-stage crushing system preferably 800-2000 mm in the first stage, 500-800 mm in the second stage and 200-500 mm in the third stage.

One or more crushing stages are employed, depending on the desired fraction size distribution of the end product. The fraction size defines the minimum and maximum length of a fraction of fragments. For the desired production of a polysilicon fraction with a fraction size of from 5 to 80 mm, from two to four crushing stages are preferably used, more preferably two crushing stages. For the controlled production of a polysilicon fraction with a fraction size of from 60 to 250 mm, 1 or 2 crushing stages may preferably be employed. It is most preferable to employ only one crushing stage.

In one embodiment, the silicon fraction is conveyed automatically via a conveyor device from one crushing stage to the next crushing stage inside the crushing system. A conveyor belt or a conveyor trough is preferably used as the conveyor device. Conveyor troughs are particularly preferably used. It is in this case possible to circumvent a crushing stage via a bypass. The control of the bypass ("bypass ON", "bypass OFF") is integrated into the superordinate controller of the overall system.

In another embodiment, the crushing stages are arranged directly adjacent one another. In this case, a crushing stage is bypassed by fully retracting the rolls, the roll spacing being at least twice as great as the maximum length of the feed material.

From the crushing system, the silicon fraction is preferably conveyed automatically to the sorting system via a conveyor device, more preferably a conveyor trough.

The sorting system is preferably a mechanical screening system and/or an optoelectronic separating system, more preferably an optoelectronic separating system. In particular, it is a device as described in EP 0 876 851 B1 (corresponding to U.S. Pat. No. 6,040,544 A). Regarding the disclosure of the optoelectronic separating system reference and explicit citation is made to the content of these documents, which are thus herein incorporated by reference.

The sorting system most preferably consists of a multistage mechanical screening system and a multistage optoelectronic separating system. All mechanical screening machines known in the technical literature may be used as a mechanical screening system. Vibrating screen machines are preferably used, which are driven by an unbalance motor. Meshed and perforated screens are preferred as a screening layer. The mechanical screening system is used to separate fine components in the product stream. The fine component contains particle sizes of up to 25 mm, preferably up to 10 mm. The fine component is further separated into other fractions by the multistage mechanical screening system. A two-stage mechanical screening system is most preferably used.

The screening stages may be arranged in series or in another structure, for example a tree structure. The screens are preferably arranged in three stages in a tree structure. When dividing the poly-fraction into four particle fractions (for example fractions 1, 2, 3, 4), fractions 1 and 2 are preferably separated from fractions 3 and 4 in a first stage. In a second stage, fraction 1 is then separated from fraction 2 and fraction 3 from fraction 4 in a third stage arranged in parallel.

The polysilicon fraction freed from fine components is preferably sorted by means of an optoelectronic separating system. The polysilicon fraction may be sorted according to all criteria which are known in image processing in the prior art. It is preferably carried out according to one to three criteria selected from the group length, surface, shape, morphology, color and weight of the polysilicon fragments, most preferably length and surface.

Other combinations of known electronic sensor techniques are nevertheless also suitable for parameter recognition of the polysilicon fragments (for example metal detectors, ultrasound, or infrared). Optical image recognition by the optoelectronic separating system has the advantage that the "real" lengths or surfaces are measured. This allows more accurate separation of the fragments according to the respectively desired parameters, compared with conventional mechanical screening methods.

The actual distribution of the feed material without a fine component, determined for example in the optoelectronic separating system by means of online monitoring (for example length distribution, surface distribution), is communicated to the superordinate control and regulating instrument and compared with predetermined setpoint distributions there. In the event of a deviation between the measured (actual) and predetermined (setpoint) distributions, the variable crushing parameters of the crushing system (for example the gap setting or the rotation speed of the rolls or the number of crushing stages) is modified by the control and regulating instrument so that the measured distribution approximates the predetermined distribution.

In a preferred embodiment, the system comprises weighing means such as a scale or balance for determining the weight yields of the classified fractions after the sorting system. The device preferably comprises a fully automatic container filling and container transport device after the sorting system.

In another preferred embodiment, the device according to the invention comprises machine-based pre-comminution before the feed instrument. In principle, any known machine-based pre-comminution is suitable, although it is preferable to use a device comprising a support as well as comminuting chisels and counter chisels, the comminuting chisels and counter chisels having a longitudinal axis which is aligned parallel to the support, and the comminuting chisels and counter chisels being mobile so that a polysilicon rod or polysilicon fragment lying on the support and to be comminuted can be fitted between the chisels, so that all chisels in the region of the polysilicon rod or the polysilicon fragment are in contact with the polysilicon rod and the comminuting chisels before or after the polysilicon rod can be moved further in the direction of their working axis to a safety distance from the counter chisels, the chisels acting on the silicon rod and breaking it up by means of an impulsive movement in the direction of their longitudinal axis. A suitable pre-comminuter is described, for example in DE 102005019873.

With machine-based pre-comminution, the device according to the invention for the first time allows fully automatic comminution of arbitrarily large polysilicon pieces, from small fragments up to whole polysilicon rods as created in the Siemens process. This starting material is reproducibly comminuted in a way which is fully automated and adjustable, to form a respectively desired target fraction, but for the first time without any mechanical refitting in the individual systems. At the same time, the method allows reliable operation and improved working ergonomics for the staff, since no manual working steps at all are required throughout the comminution and classification process.

The control and regulating device preferably consists of a management system in the form of a programmable logic controller (PLC) which can manage and regulate the controls of all subsystems (for example pre-crusher, conveyor instruments, crushing system, mechanical and optical sorting system, automated container handling with formula management and management of the control logic). The cross-subsystem visualization and operation is carried out by a superordinate management system. The error and operating messages of all subsystems are copied together in an error or operating message database, evaluated and visualized.

Only the expedient combination of the individual systems to form the device according to the invention and the logical interconnection by means of a superordinate controller allows a system with which any kind of polysilicon fraction ("small" and "large") can be produced, without requiring mechanical refits for various crushing and sorting processes.

Entering the desired target fraction into the superordinate control and regulating device leads to a corresponding adjustment of the parameters of the crushers in order to achieve the desired fraction size of the polysilicon fraction.

Magnetic separators (for example plate magnets, drum magnets or strip magnets) may be arranged between the individual crushing stages as well as inside and after the sorting systems, in order to remove foreign bodies from the polysilicon fraction and reduce the metal contamination of the polysilicon fraction.

It is another object of the present invention to provide a method for comminuting and sorting polysilicon, which leads to a polysilicon fraction having reproducibly defined properties with high yields.

This object is achieved by a method, in which a coarse polysilicon fraction is comminuted in a device according to the invention. To this end, the coarse polysilicon fraction is conveyed into a crushing system in which variable adjustment of at least one crushing parameter is possible, and is comminuted there to form a polysilicon fraction which is subsequently conveyed into a sorting system and classified there, one or more actual values for a defined parameter of the polysilicon fraction respectively being measured in the sorting system and the measured actual value or values being sent to a superordinate control and regulating instrument and compared with a predetermined setpoint value in the control and regulating instrument and, if there is a deviation between the actual value and the setpoint value, the control and regulating instrument modifies the setting of the crushing parameter of the crushing system so that the polysilicon fraction's actual value approximates the predetermined setpoint value.

The method preferably uses the parameters mentioned in the description of the device.

For example, if the fraction distribution's average length value (actual value) determined in the first optical separating stage is greater than the setpoint value, then the gap spacing in the crusher is correspondingly adjusted or reduced so that the fraction distribution is thereby shifted toward smaller sizes.

The measurement of the product parameters and the classification of the polysilicon fraction are preferably carried out as described below: The oversize of the first mechanical screening stage is sent to a multistage optoelectronic separating system. In each optoelectronic sorting stage, the product stream is individualized via an integrated vibrating conveyor trough and travels over a slide in free fall past one (or more) CCD color line camera(s) which carries or carry out a classification according to one or more of the parameters length, surface, volume, shape, morphology and color in any combination. As an alternative, all electronic sensor techniques known from the prior art may be used for parameter recognition of the fragments. The measurement values are communicated to the superordinate control and regulating instrument and evaluated, for example by means of a microprocessor. By comparison with the sorting criterion stored in the formula, a decision is thereby made as to whether a fragment is extracted from the product stream or allowed to pass through. The extraction is preferably carried out by compressed air pulses. Via a bank of valves arranged below the image recognition, for example, separating channels (compressed air banks) are operated and receive dosed compressed air pulses, which depend on the particle size. The transmitted stream and the extracted stream are then removed separately and sent to the next optoelectronic sorting stage. As an alternative, the extraction may also be carried out hydraulically or mechanically.

Sensor-based recognition, preferably optical recognition, has the advantage that the "real" lengths, surfaces or shapes are measured. This allows defined and more accurate separation, for example with respect to length, compared with conventional mechanical screening methods. Thus, the overlap between two fractions to be separated can be made smaller. On the other hand, the separating limits can be adjusted arbitrarily via the predetermined parameters (the formula) of the superordinate controller, without having to perform modifications on the machine itself (for example changing the screening layer). Accordingly, the optoelectronic screening system can be used equally for separation into both small and large fraction size ranges. Furthermore, the entire system can be regulated via "online" measurement, for example by correcting the gap spacing directly in accordance with the crushing result. Optoelectronic sorting also offers the advantage that more accurate separation of the fragments according to the respective requirements (for example high cubicity of the fragments) is possible through a combination of surface and length.

The classified fractions of the silicon fractions are collected and preferably introduced into containers. The filling is preferably automated, as described for example in EP 1 334 907 B. The container transport and filling with the classified material are preferably fully automated.

The method preferably comprises machine-based pre-comminution. The pre-comminution is preferably carried out by placing the polycrystalline silicon in the pre-comminuter on a height-adjustable support, and fitting it there between the comminuting chisels and counter chisels so that all chisels in the region of the silicon are in contact with the silicon and comminuting chisels and counter chisels before or after the silicon are brought together up to a safety distance and a repetitive striking pulse is started for all comminuting chisels bearing on the silicon, which leads to comminution of the silicon. The polycrystalline silicon used preferably comprises polycrystalline silicon rods, as obtained for example by Si deposition in the Siemens process. Arbitrarily shaped residues from other silicon processing methods (for example crucible pulling processes, cutting methods, etc.) may also be used.

The method according to the invention allows controlled and reproducible production of a silicon fraction in an arbitrary size distribution with a maximum fraction size of 250 mm. The method also for the first time allows the controlled production of a no longer flow-capable cubic polysilicon fraction with a size of from 45 to 250 mm, reproducibly, and in a high yield. Such a fraction is needed in order to achieve a high fill factor of a crucible in crucible applications. Furthermore, the lower specific surface of such a fraction leads to a smaller specific contamination surface and therefore higher quality since, for example in crucible applications, the metal inclusion per kilogram of weighed crucible batch is less. Further advantages of larger fraction sizes are an improved economic viability of subsequent purification processes, because the acid consumption is commensurately less as the specific surface of the polysilicon fraction to be purified is smaller.

The invention therefore also relates to a cubic polysilicon fraction with a size of from 45 to 250 mm, preferably from 90 mm to 170 mm. The highly cubic shape is characterized in that the ratio of the weight of a fraction to the maximum length of a fraction as an average over all the fractions is $\geq 3$ g/mm, preferably $\geq 5$ g/mm. Such fragments are desirable for a high fill factor of crucibles in crucible applications.

The method according to the invention is preferably followed by purification of the polysilicon fraction. This purification may, for example, be carried out as described in EP 1338682 A2 p. 8, paragraph 0054 or 0055 of U.S. Pat. No. 6,309,467. A silicon fraction produced in this way has a semiconductor-grade purity and fulfills at least the following requirements of surface purity: monitor element iron on average <100 pptw, preferably <50 pptw.

The following examples serve to explain the invention further. The following fraction sizes were produced in the examples:

Fraction 0: fraction sizes with a distribution of approximately 0 to 3 mm

Fraction 1: fraction sizes with a distribution of approximately 1 mm to 10 mm Fraction 2: fraction sizes with a distribution of approximately 10 mm to 40 mm Fraction 3: fraction sizes with a distribution of approximately 25 mm to 65 mm Fraction 4: fraction sizes with a distribution of approximately 50 mm to 110 mm Fraction 5: fraction sizes with a distribution of approximately >90 mm to 250 mm The parameters for the target fraction to be produced are entered into the superordinate measuring and control device. Since a respectively desired particle distribution in the target fraction and the secondary fractions is dictated by the further use of the fraction to be produced, the target fractions are generally stored as formulae in the superordinate measuring and control device and are selected accordingly. In the present example, the device was used to produce four different target fractions (fractions 2, 3, 4 and 5). The production of a target fraction also created secondary fractions (sub-fractions and sometimes super-fractions). All parameters for the pre-comminuter, the crusher and the optoelectronic separating system are stored in the formulae. In the example (for the controlled production of fraction 5), the following parameters were stored in the formula:

Number/selection of the striking chisel pairs and forward feed of the carriage so that the desired setting leads to impact on the polysilicon rod, or material to be comminuted, at a distance of approximately 15 cm.

The first crushing stage was operated with a circumferential speed of 1 m/sec and a gap spacing (tooth tip to the opposite roll bottom) of 90 mm. Further crushing stages were circumvented via a bypass.

The fine component (fractions 0 and 1) of the material crushed in this way was separated at the mechanical screen with a mesh width of approximately 10 mm, and the separated component was subsequently separated into the fractions 0 and 1 with a further mechanical screening system or a further screen, with an approximately 4 mm mesh width.

The coarse component (fractions 2, 3, 4 and 5) was sent to the optical separating system via a conveyor trough (whose conveyor characteristics, for example frequency, are likewise stored in the formula) and separated as follows via three optical stages: fractions 3 & 2 were separated from fractions 4 & 5 in the first stage. A maximum length of 55 mm was stored as the separating limit in the formula. Fractions 3 & 2 were separated into the fractions 3 and 2 in a second stage, i.e. a separating limit of 30 mm stored in the formula. Fractions 4 & 5 were separated into the fractions 4 and 5 in a third stage with a separating limit of 100 mm.

Magnets for separating metallic contaminants may be installed between the various system parts, for example conveyor troughs, according to the prior art.

The measurement quantities of length and/or surface are used as control parameters, and/or the weight yields measured by balances at the outputs of the sorting system. Manipulated quantities are the forward feed of the pre-comminuter and the gap spacings of the crushers. The manipulated quantities are stored beforehand in the formula. The logic between control parameters and manipulated quantities is likewise stored in the formula. This is represented in Example 4.

EXAMPLE 1

A polysilicon rod (L=0.25–4 m, D=20–250 mm) is placed on the crushing table of the pre-comminuter. Visual quality control of the rod for foreign bodies, deposits and morphology of the surface is carried out on the crushing table. The rod is placed on a crushing carriage, which conveys the rod automatically into the crushing chamber.

In a device similar to FIG. 1 of DE 102005019873, an Si rod to be comminuted is put on the bearing prism of the support. The bearing prism is formed by the long sides of two trough shells arranged mutually parallel. The trough shells are installed so that they can be rotated on the crushing carriage.

A guide rail installed parallel to the crushing carriage makes it easier to fix the Si rod when positioning it. The crushing carriage with the Si rod is subsequently moved into the crushing space, i.e. the region between the chisels. The crushing process is controlled via displacement recording of the carriage, and can be selected variably. After the crushing carriage has reached its position, the 3 counter chisels are firstly moved onto the rod in order to fix it. The comminuting chisels are moved onto the rod with a time delay and the crushing cycle is started. The crushing process is not stopped until the first rod piece is broken and the comminuting chisels have reached a defined end position. The comminuting chisels and counter chisels are then simultaneously moved back into the starting position and the crushing carriage cycles to the next crushing position. The crushing process begins again. This process is repeated until the entire rod is broken. The length of the Si rods may in this case be different. After the crushing process, the crushing carriage is moved into a defined end position, the rotatably mounted trough shells are rotated through approximately 150° relative to each other and the Si fraction is discharged onto a conveyor trough installed under the crushing carriage for further transport.

The pre-comminuted fragments (coarse polysilicon fraction) have a length of less than 25 cm. They are discharged automatically into a conveyor trough, which conveys the material to the multistage crushing system.

EXAMPLE 2

Instead of the polysilicon rod, individual silicon fragments with a length of more than 25 cm are placed on the crushing table and comminuted as described in Example 1.

EXAMPLE 3

A coarse polysilicon fraction (from Example 1, 2 or the manual comminution according to the prior art) is sent via a feed device, preferably a funnel, to a roll crusher.

For the controlled production of fraction 5, the first crushing stage is operated with a circumferential speed of 1 m/sec and a gap spacing (tooth tip to opposite roll bottom) of 90 mm. Other crushing stages are circumvented via a bypass. The crushed material is sent to the sorting system via a conveyor trough (whose conveyor characteristics, for example frequency, are likewise stored in the formula).

The fine component (fractions 0 and 1) of the material crushed in this way is separated at the mechanical screen with a mesh width of approximately 10 mm, and the separated component is subsequently separated into the fractions 0 and 1 with a further mechanical screening system or a further screen, with an approximately 4 mm mesh width.

The coarse component (fractions 2, 3, 4 and 5) is sent to the optical separating system and separated as follows via three optical stages: fractions 3 & 2 were separated from fractions 4 & 5 in the first stage. A maximum length of 55 mm for polysilicon fragments was stored in the formula, i.e. fragments whose length is less than 55 mm are blown off. The fractions 3 & 2 blown off were separated into the fractions 3 and 2 via a conveyor trough and a subsequent second stage, i.e. a separating limit of 30 mm stored in the formula. Fractions 4 & 5 were separated into the fractions 4 and 5 in a third stage with a separating limit of 100 mm.

Figure 2:
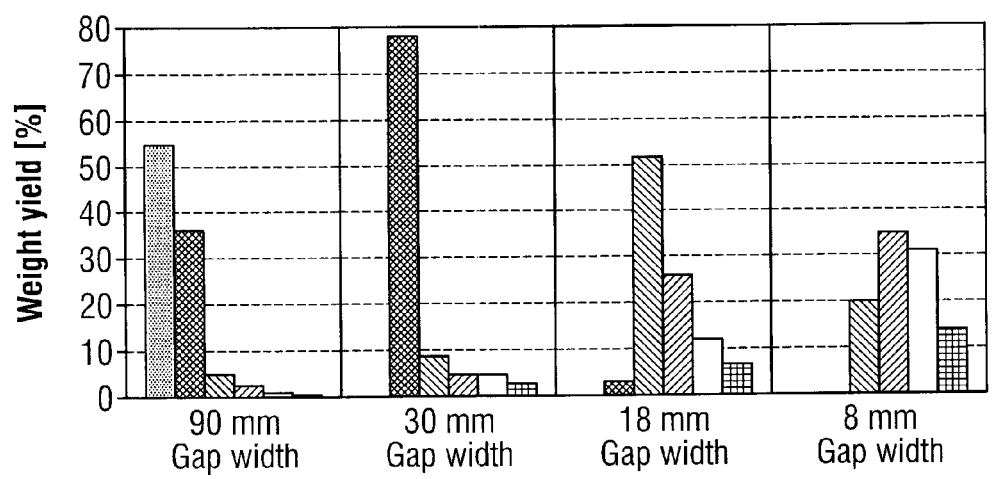
FIG. 2 shows the result of the crushing of Example 2.
Figure 3:
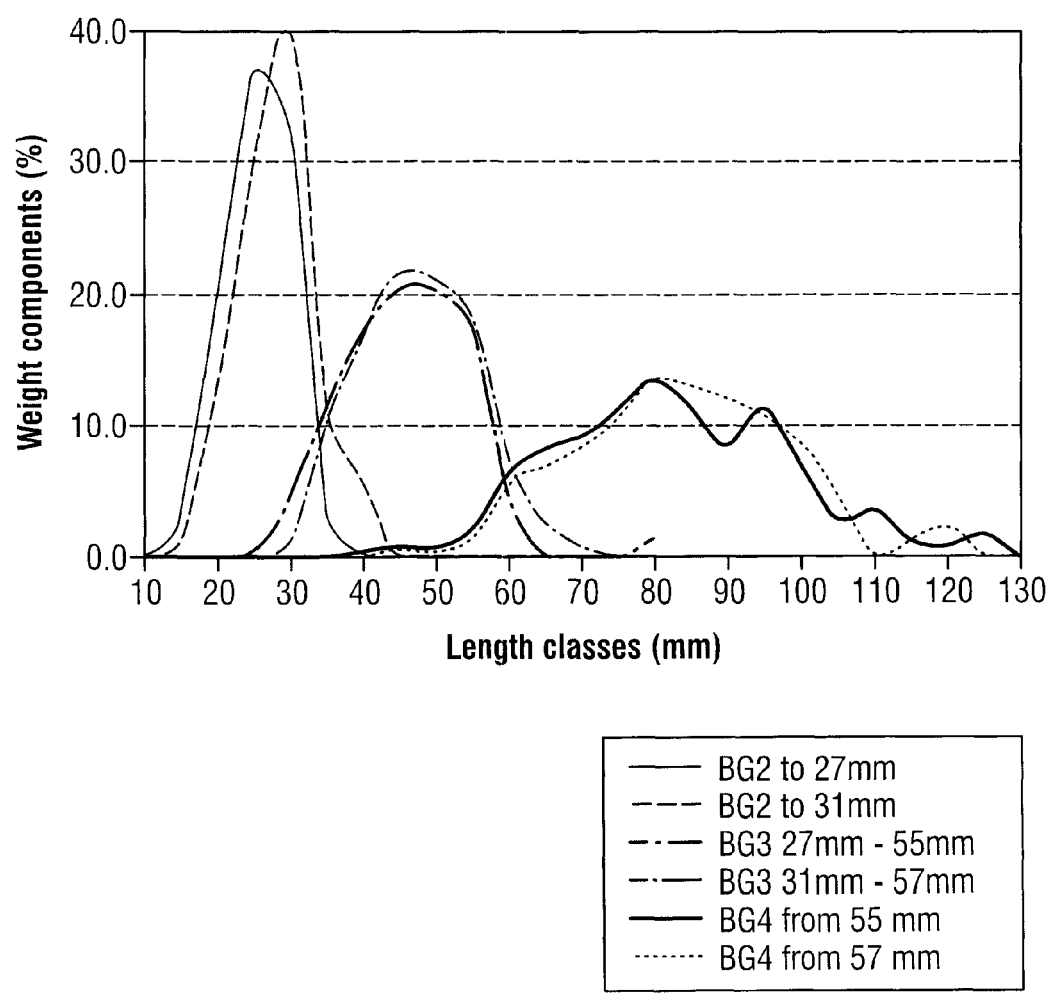
FIG. 3 shows the effect of the sorting limit set in the optoelectronic separating system, "maximum length of a fragment", on the fraction size distribution of the classified fractions.

FIG. 2 shows the result of the comminution and classification. It can be seen clearly any desired particle size distribution can be produced (by simple parameter entry) using a combination of 2 successively arranged crushers and a corresponding selection of the gap spacings.

For instance, large fragments with a length of more than 90 mm (size 5) and a cubicity of >3 g/mm can be produced, for example with a weight yield of >50%, using one roll (diameter 1 m) and a roll spacing of about 90 mm. The secondary creation of a fine component (sizes 2, 1 and 0, with a length of less than 40 mm) is less than 5 wt. %.

A fine fraction with a length of less than 40 mm (sizes 2, 1 and 0) may on the other hand be produced, for example with a weight yield of >80%, by a combination of 30 mm and subsequently 8 mm roll spacings (roll diameter 650 mm). There is no secondary creation of the large fragments (sizes 4 and 5).

The weight yields in the example were measured for comparative purposes using a separate balance, or weight measurement of the individual fractions by balances after crushing and screening at the outputs of the sorting system.

The parameters determined by the "online" measurement are reported back to the superordinate control and regulating unit, and compared there with the selected predetermined parameters. If necessary, for example, the gap spacing of the roll crusher may then be directly corrected or adjusted in order to bring the measured parameters into accordance with the predetermined parameters.

EXAMPLE 4

The software parameters relating to separating limits of the individual fractions were varied. The values relating to maximum or minimum allowed length of the fragments in the individual fractions were modified by a few millimeters in the formula for controlling the optoelectronic separating system. In the example, the separating limit for the blow-off between fractions 2 and 3 was changed from 27 mm to 31 mm and between fractions 3 and 4 from 55 mm to 57 mm. Even this program parameter modification of only a few millimeters is apparent in the production properties (for example length distribution), i.e. the separating limits between the individual fractions can be flexibly adapted to the respective customer specification with high accuracy by simple formula selection, or employed in the scope of the online regulation in order to achieve desired setpoint values.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for comminuting and sorting polysilicon, comprising:
feeding a fraction of coarse polysilicon into a crushing system having at least one adjustable crushing parameter;
crushing the coarse polysilicon in the crushing system to form crushed polysilicon;
sorting the crushed polysilicon by a sorting system having at least one adjustable sorting parameter,
wherein the crushing system and the sorting system are linked to a controller which allows variable adjustment of at least one crushing parameter in the crushing system and at least one sorting parameter in the sorting system, in response to a measured parameter of at least one fraction of crushed polysilicon,
and recovering at least one fraction of crushed polysilicon.

2. The method of claim 1, further comprising a conveyor which transports polycrystalline silicon from the crushing system to the sorting system.

3. The method of claim 1, wherein the sorting system is provided with a measuring instrument for measuring at least one defined parameter of a classified polysilicon fraction, and this measuring instrument supplies measured parameters to a superordinate control and regulating instrument which compares the measured parameters with a target parameter and, if there is a deviation between the measured parameter and the target parameter, the superordinate control dictates change in the setting of a crushing parameter of the crushing system so that the parameter then measured approximates the target parameter.

4. The method of claim 1, wherein the crushing system is a multistage crushing system consisting of from 1 to 10 crushers.

5. The method of claim 4, wherein the crushers are roll crushers or jaw crushers.

6. The method of claim 4, wherein the crushers are spiked roll crushers.

7. The method of claim 1, wherein the crushing system is a multistage crushing system consisting of from 1 to 3 crushers.

8. The device method of claim 1, wherein the sorting system comprises a multistage mechanical screening system and a multistage optoelectronic separating system.

9. The method of claim 1, wherein a two-stage mechanical screening system is used in combination with a three-stage optoelectronic separating system arranged in a tree structure, in which the sorting of the crushed polysilicon is carried out by means of online monitoring according to one or more criteria selected from the group consisting of length, surface, shape, morphology, color and weight of polysilicon fragments.

10. The method of claim 1, wherein a fully automatic container filling and container transport device is provided after the sorting system.

11. The method of claim 1, wherein a pre-comminuter comprising a support, comminuting chisels and counter chisels is located before the crushing system, the support, comminuting chisels and counter chisels being movable so that a polysilicon rod or fragment lying on the support, which is to be comminuted can be positioned between the chisels, so that all chisels in the region of the polysilicon are in contact with the polysilicon and the comminuting chisels located before or after the polysilicon can be moved further along their working axis to a safety distance from the counter chisels, and a transport device is provided which conveys the Si fraction from the pre-comminuter to the crushing system.

12. The method of claim 1, wherein a coarse polysilicon fraction is conveyed into a crushing system in which at least one crushing parameter is adjustable, and is comminuted to form a polysilicon fraction which is subsequently conveyed into a sorting system and classified by the sorting system, at least one actual value of a defined parameter of the polysilicon fraction being measured in the sorting system and the actual measured value input to a superordinate control and regulating instrument and compared with a targeted setpoint value stored in the control and regulating instrument and, if there is a deviation between the actual value and the setpoint value, the control and regulating instrument modifies the setting of one or more crushing parameters of the crushing system and the setting of one or more sorting parameters of the sorting system so that the polysilicon fraction's actual value subsequently measured approximates the targeted setpoint value.

13. The method of claim 1, wherein a coarse polysilicon rod is comminuted to form a polysilicon fraction without thermal pre-treatment.

* * * * *